United States Patent [19]
Delahoy et al.

[11] Patent Number: 4,625,071
[45] Date of Patent: Nov. 25, 1986

[54] PARTICULATE SEMICONDUCTORS AND DEVICES

[75] Inventors: Alan E. Delahoy, Rocky Hill; Frank B. Ellis, Jr.; Albert Rose, both of Princeton, all of N.J.

[73] Assignee: Chronar Corp., Princeton, N.J.

[21] Appl. No.: 668,131

[22] Filed: Nov. 5, 1984

[51] Int. Cl.[4] .......................................... H01L 31/06
[52] U.S. Cl. .................................. 136/250; 357/15; 357/30
[58] Field of Search ...................... 136/250; 357/15, 30

[56] References Cited
U.S. PATENT DOCUMENTS

| | | | |
|---|---|---|---|
| 2,877,284 | 3/1959 | Schultz | 136/265 |
| 3,038,952 | 6/1962 | Ralph | 29/572 |
| 3,522,339 | 7/1970 | Te Velde | 264/129 |
| 4,107,724 | 8/1978 | Ralph | 357/30 |
| 4,357,400 | 11/1982 | Appleby | 429/111 |
| 4,434,318 | 2/1984 | Gibbons | 136/258 |

Primary Examiner—Aaron Weisstuch
Attorney, Agent, or Firm—George E. Kersey

[57] ABSTRACT

A semiconductor device in which particles of semiconductive material extend as separate chains from respective first and second contacts. When one of the contacts is of p-type material, the conductive materials that extend from it are of likewise p-material. Similarly, when the contact is of n-type material, the chain that extends from it is also of n-material. In any case the particles can include both p-type and n-type. One of the contacts can have a prescribed work function and the other contact have a lower work function in order to produce a prescribed junction between the two contacts. In addition the contacts may be polymeric. The particulate bodies may range in size from 10 to about 3000 angstroms in diameter. The n-type particles provide a continuous path for electrons and the p-type particles provide a continuous path for holes. The particles are adhered to one another by an inorganic or organic binder, pressure, heat treatment or thermal fusion. Particles for the semiconductive device can be produced by introducing a gaseous phase semiconductane into a reaction chamber, creating particles from the semiconductane and collecting the particles thus created.

10 Claims, 9 Drawing Figures

PARTICULATE SEMICONDUCTORS AND DEVICES

BACKGROUND OF THE INVENTION

This invention relates to the production of semiconductors, particularly for use in photovoltaic devices.

Semiconductors are useful in a wide variety of devices. Examples include memories, field effect and thin film devices, displays and luminescent devices.

Semiconductors are particularly useful in photovoltaics that provide electric power when subjected to radiation. Unfortunately, photovoltaic devices are presently not competitive with conventional sources of electric power. This has been caused primarily by the cost of manufacturing suitable materials. Initially, expensive and relatively thick single crystal material was required.

More recently, amorphous material with suitable photosensitivity has been fabricated by a variety of techniques, including glow discharge and chemical vapor deposition. Devices prepared by these techniques are somewhat less costly than those based on single crystal material.

Accordingly, it is an object of the invention to reduce the cost of producing semiconductive materials, particularly those with suitable photoresponsive properties.

Another object is to achieve an alternative technique for producing suitable semiconductive materials. A related object is to enhance the performance of semiconductive material of given quality. Another related object is to avoid the objections and difficulties associated with the production of amorphous semiconductor layers.

Still another object of the invention is to simplify the production of suitable semiconductors and semiconductor devices. Further objects are to achieve increased production rates, and to facilitate the large area production of solar cells.

SUMMARY OF THE INVENTION

In accomplishing the foregoing and related objects, the invention provides for the production of layers of semiconductor particles, as opposed to homogeneous semiconductor layers, and for the incorporation of the particles thus produced into semiconductor devices.

In accordance with one aspect of the invention, the particles, which may be amorphous or crystalline, are produced by introducing a gas-phase semiconductane (e.g. of a semiconductor hydride or halide) into a reaction chamber where the desired particles are produced by nucleation of the semiconductane, after which the particles are collected. Nucleation of the semiconductane is achieved by controlling the parameters associated with the operation of the reaction chamber. The most important parameters are temperature, pressure, and rate of flow of the precursor material into the reaction chamber. The desired particles may also be produced in other ways, e.g. by grinding precipitation of particles (including colloidal particles) from a solution, light-induced (including laser) decomposition of a semiconductane, etc.

In accordance with another aspect of the invention, the desired collection of particles is achieved by thermophoresis. In this process a temperature gradient is established between one surface and another surface, with the two surfaces constituting a channel of flow of the precursors. As a result of the temperature gradient, which can be uniform or non-uiniform but does not change sign throughout its range, one of the surfaces is at a lower temperature than the other, and the desired particles are collected on the cooler surface.

In accordance with yet another aspect of the invention, the semiconductane which is a precursor for the semiconductor particles is maintained at a pressure above 5 Torr in the reaction chamber, and the precursor can be supplemented by an inert gas carrier with a pressure in the range from 0 to 5 atmospheres. When the precursor is unaccompanied by a dopant gas, the particles formed are intrinsic. When the precursor is accompanied by a suitable dopant, the particles are either p- or n-type depending on the dopant. For p-type doping the precursor gaseous stream is accompanied by, for example, a boron hydride gas. For n-type doping, for example, the accompanying gas can be a phosphorous hydride.

In accordance with a further aspect of the invention, particles of different conductivity types are mixed to produce a particulate semiconductor of particles ranging in size from about 10 Angstrom units to about 3,000 Angstrom units. It will be understood that the size dimension of the particles refers to a characteristic particle diameter. The particles may be shperical, polyhedral, irregular, or string-like in shape. If the particles are string-like, the characteristic diameter is that of the cross-section of the string at a minor axis. The particles of the semiconductor are of n- or p-type and are desirably present in substantially the same amounts. However, the semiconductor may include particles of intrinsic conductivity. At least some of the particles are in contact with one another.

It is desirable for sufficient n-type particles to be in contact with one another to provide a continuous path for electrons to an "n" region, serving as a contact, and for sufficient p-type particles to be in contact with one another to provide a continuous path for holes to a "p" region, serving as a contact. In other words, starting at any particle between the opposing contacts, it is desirable to have a continuous path formed by particles of like type to the corresponding type of contact.

An important advantage of the use of more than one particle type is that it allows for the physical separation of electrons and holes, thereby increasing the lifetime of the electron-hole pairs and consequently, the photoelectric response of the device. This results from the establishment of electric fields within and between particles of different types that are in contact with one another. It may be noted further that when an n-type particle is brought into contact with a p-type particle, the two particles are converted by proximity doping to substantially intrinsic particles because of separation of mobile carriers. The condition for this to occur is that the depletion width (space-charge region) is greater than the particle size. This precludes the use of comparatively large particles which are over several microns (several 10,000 Angstroms) in diameter.

In accordance with yet another aspect of the invention, a semiconductor device is formed by interposing a plurality of semiconductive particles between a set of contacts, which may be of semiconductor, polymeric, or metallic material. In either case the contacts have surfaces which are in intimate contact with the semiconductive particles.

DESCRIPTION OF THE DRAWINGS

Other aspects of the invention will become apparent after considering several illustrative embodiments taken in conjunction with the drawings, in which.

DETAILED DESCRIPTION

Figure 1A:
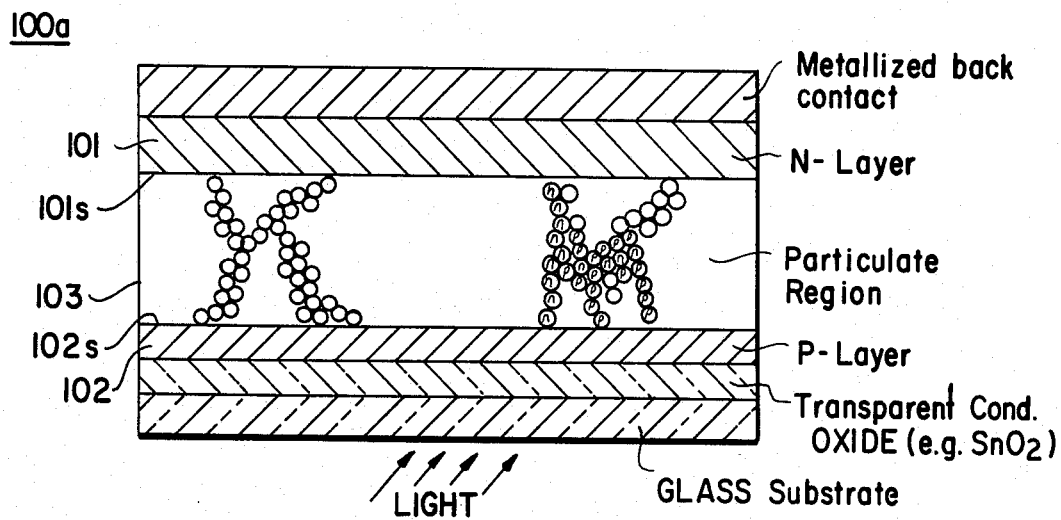
FIG. 1A is a schematic diagram of a first semiconductor device in accordance with the invention.

The invention makes use of electron-hole pairs and provides for the separation of and different conduction paths for electrons and holes, thereby reducing recombination of electrons and holes and consequently increasing the photoelectric response of a device in which they are generated. The different conduction paths are provided by chains of particles of the same conductivity type in intimate contact.

All but a small percentage of the particles will participate in particle chains of the same conductivity type which extend to the appropriate collection region which serves as a contact. This can be understood by observing that the probability of a chain terminating within the film is approximately $(\frac{1}{2})^n$ where n is the particle chain coordinate number (number of sites for intimate particle contact to the chain) and a random particle distribution is assumed for approximately equal numbers of the two different particle types. Since n increases with chain size, effectively all of the particle chains extend to the desired region, except a small percentage of particles in very short chains. For example, if $n=8$ for a single particle, $(\frac{1}{2})^8 \times 100\%$ or 0.4% of the particles constitute a chain of one particle, that is, are isolated from particles of similar conductivity type and $(\frac{1}{2})^{14} \times 100\%$ or 0.006% of the particles form two particle chains. The existence of continuous paths of given particle type to a collecting plane for almost all starting particles within a random assemblage of two types of particles with six-fold coordination ($n=6$) has been confirmed.

The electrons and holes are separated into the different conduction paths by internal electric fields produced by contiguous particles of different conductivity types which form a semiconductor junction. For example, in the case of n-type and p-type particles in contact with each other, the electric field is such that photo-generated holes drift to the p-type particles and photo-generated electrons drift to the n-type particles. The electrons and holes may then be collected at the n- and p-type contact regions respectively by conduction along n- and p-type particle chains leading to these areas.

The particles can be bound together in many ways to achieve the object of the invention. For example, they may be held together using an inorganic or organic binder, or by pressure, or be thermally fused crystallites, or be sintered under pressure. Alternatively, a suspension of the particles may be sprayed onto a heated substrate and then fired. If passivation of particle boundary surface states is desired, it can be provided by a choice of binder (if used) or by some post-deposition treatment such as passivation by atomic hydrogen.

The principle of this invention (the separation of photo-generated electrons and holes into contiguous paths by means of local fields generated by contiguous n- and p-type materials) can also be achieved by replacing one of the types of particles, either n- or p-type, by a continuous binder of the same n- or p-type. The resulting structure then has the format of raisins in a pudding. The raisins are, for example, fine particles of n-type material sufficiently densely packed that they are in mutual contact. The binder would then be p-type and would insure a continuous path for photo-generated holes.

The invention may also be realized by the formation of a solid semiconductor body consisting of n- and p-type regions randomly (or otherwise) distributed but such that the p- or n-contiguous paths comprised of contiguous n- and p-type regions still exist.

With reference to the drawings, FIG. 1A sets forth a schematic diagram of a first type of semiconductor device 100a in accordance with the invention. The device 100a is a solar cell which is generally designated as a PIpsN device, where P designates p-type material, N designates n-type material, and Ips designates a particulate semiconductor. This kind of device is analogous to the ordinary PIN solar cell, with particulate matter substituted for the I or intrinsic layer.

In the specific structure of FIG. 1A the particulate region 103, formed from n-type and p-type particles in a manner more particularly described below, is bounded by a P layer 102 forming interface 102S on one side of the particulate region 103, and by an N layer 101 forming interface 101S on the other side of the particulate region 103.

The device of FIG. 1A is fabricated on a glass substrate which also acts as a protective support. The substrate is coated by a transparent conductive material such as conductive tin oxide. P region 102 in the form of a transparent p-doped semiconductor is bonded to the transparent conductive material.

An N region 101 of amorphous or other silicon is bonded to a metallic back contact. The back contact is desirably metallized upon the n-type material in order to provide the desired ohmic contact for external connections.

The solar cell 100a of FIG. 1 is operated by shining conventional light on the glass substrate. The light passes through the protective glass support into the transparent semiconductive oxide and then into the P layer. In the particulate region 103, beyond the interface 102s and before the interface 101s, the entry of light energy brings about the generation of holes and electrons in the n- and p-type particles.

The result is a flow of electric current when a load is connected to the metallized layer on the region 101 and the transparent conductive material. In the operation of the device the particles in the region 103 form various continuous paths for respective p- and n-particles between the n and p layers 101 and 102. In the case of the p-particle path there is a movement of holes to the P region. Conversely, for the continuous n-particle paths there is a flow of electrons to the N region. When contacts for an external circuit are attached to the metallized portion on the N region 101, and to the transparent conductive material under the P region 102, holes are withdrawn at a positive terminal and electrons are withdrawn at a negative terminal.

The P layer 102 and the N layer 101 may also be particulate.

Figure 1B:
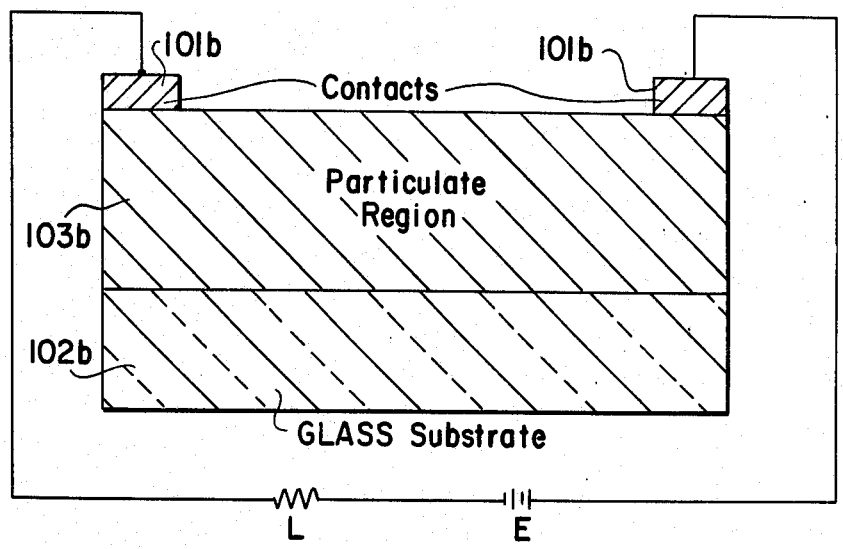
FIG. 1B is a schematic diagram of an alternative semiconductor device in accordance with the invention.

A device which illustrates the use of the particulate region independently of auxiliary p- and n-layers is depicted in FIG. 1B. The device 100b of FIG. 1B is a photodetector. It is formed by a particulate region 103b which is similar to the region 103 of FIG. 1A. The region 103b is supported by a glass substrate 102b that allows for the entry of light. Detection takes place by the flow of current into a contact 101b on the particulate region 103b and out of the corresponding contact 101b at the opposite end of the particulate region 103b. When there is no light incident on the glass substrate 102b, the dark resistance of the particulate region 103b limits flow of current from the voltage source E and hence the absence of any appreciable voltage at the load L. However, when the substrate 100b is exposed to light, the resistance is significantly reduced, permitting the flow of current through the particulate region 103b and the production of a voltage drop at the load L.

As in the case of the device 100a of FIG. 1A, the device 100b of FIG. 1B employs a region with particles produced in the manner illustratively described below.

Figure 1C:
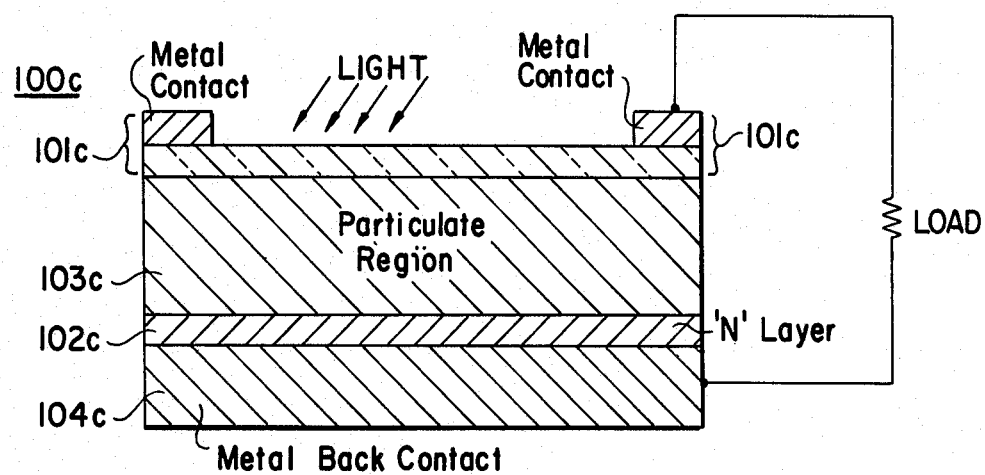
FIG. 1C is a schematic diagram of still another illustrative semiconductor device in accordance with the invention.

Still another device employing a particulate region in accordance with the invention is provided by the Schottky-type diode of FIG. 1C. The diode 100C includes a particulate region 103c, again fabricated as described below, bounded by a high work function metallic layer 101c, and an n-layer 102c on the opposite surface. The device 100c is completed by a metallic back contact 104c on the n-layer 102c.

The high work function metal of layer 101c is such that a significant energy (in electron volts) is required to remove an electron from the metal to vacuum level. Suitable metals include gold and platinum. The metallic back contact 104c is of a durable support metal such as stainless steel.

The Schottky-type diode 100c of FIG. 1C can function both as a rectifier or as a solar cell. In general, a Schottky diode includes a metal deposited upon a semiconductor layer with an underlying p- or n-layer to facilitate ohmic contact. For the present invention, the Schottky-type device can be represented by MIpsS, where M is a high work function metal, Ips represents a particulate semiconductor region and S is an n-type semiconductor. Where the metallic layer 101C has a low work function, the semiconductive region S is of p-type material.

In general, the particulate regions 103a, 103b, and 103c are occupied by semiconductor particles which can vary in size from about 10 to 3000 Angstroms. The particles are variously p- and n-type which, as noted above, form n- and p-paths throughout the particulate region. In general, the particulate region can form a junction with P or N layers. High work function metals such as platinum and gold can be used in place of a p-type semiconductor, while a low work function metal such as chromium or aluminum can be used in place of an n-type semiconductor.

Figure 1D:
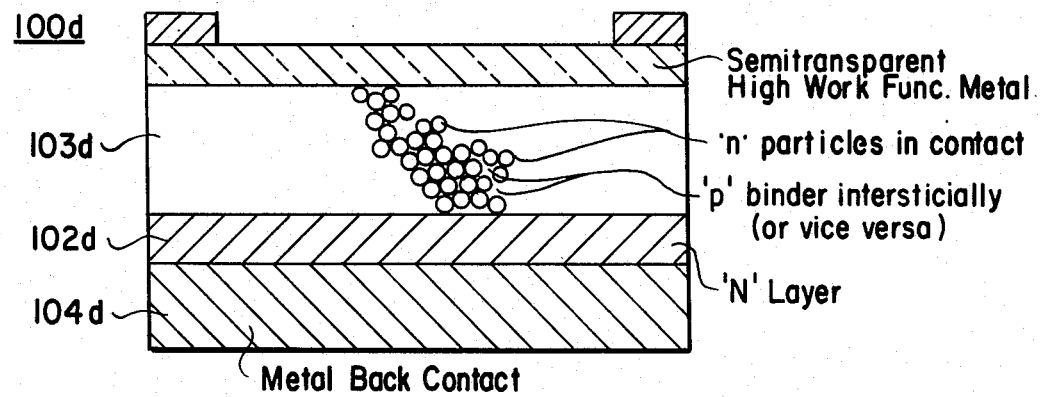
FIG. 1D is a schematic diagram of a further illustrative embodiment.

The device 100d of FIG. 1D is the same as the Schottky diode 100c of FIG. 1C except that a different type of particulate region 103d is used. Particulate region 103d illustrates the structure described as "raisins in pudding" discussed above.

Figures 2A, 2B:
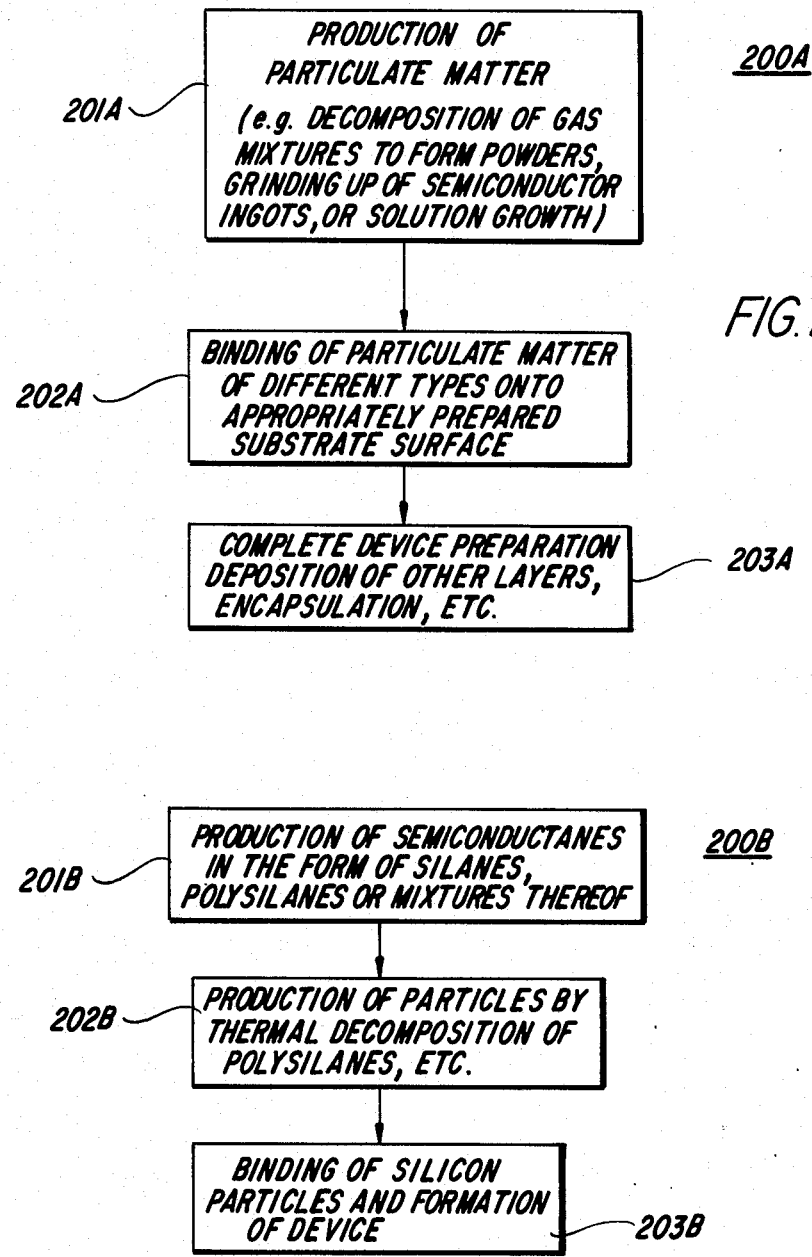
FIG. 2A is a flow chart for preparing particulate semiconductors in accordance with the invention.
FIG. 2B is an adaptation of the flow chart of FIG. 2A for preparing particulate silicon.

With further reference to the drawings, FIG. 2A sets forth a flow chart 200A for the general practice of the invention while FIG. 2B provides a flow chart 200B for the preparation of particulate silicon.

Semiconductanes for the practice of the invention are selected from Group IV of the Periodic Chart and thus include germane. As noted below, a particularly suitable set of semiconductanes consists of silanes. Semiconductanes are generally composed of a semiconductor element in combination with elements such as hydrogen and halides. Monosemiconductanes include four atoms of hydrogen or halide, while polysemiconductanes which involve a plurality of semiconductor atoms, include sufficient atoms of hydrogen and/or halide to satisfy the valence requirements of the resulting molecule.

Semiconductanes can be prepared in a variety of ways, which are well known. Once prepared, the semiconductanes are introduced into a reaction chamber in accordance with process block 202A. While in the chamber the semiconductanes are converted to semiconductor particles.

In particular, the invention is suitable for the production of particulate silicon in accordance with the flow chart 200B of FIG. 2B. The semiconductanes for this purpose take the form of silanes, polysilanes, or mixtures of the foregoing, as indicated in block 201B. Once produced, the silanes and/or polysilanes are introduced into a reaction chamber as indicated by process block 202B. While in the chamber the polysilanes are converted to particles by thermal decomposition.

The precursors further include dopants and inert gas carriers, depending upon the nature of the particles to be achieved.

A suitable operating pressure to achieve nucleation and subsequent growth of granules is in the range above about 5 Torr extending to about 5 atmospheres. The partial pressure of the precursors is above about 5 Torr, while that of the dopant is negligible and that of a possible inert gas carrier may range from about 0 to about 5 atmospheres.

The temperature gradient is desirable in the reaction chamber to improve the efficiency of particle collection. The temperature gradient promotes the migration of particles in the gas in a direction opposite to that of the temperature gradient. This phenomenon is called "thermophoresis". Thus particles collect on the cooler surface.

A suitable operating temperature for the conversion of semiconductanes to amorphous semiconductor particles is in the range from about 200° C. to about 500° C. depending upon the precursors. A particularly suitable range is from about 400° C. to about 480° C. for disilane. Crystalline semiconductor particles may be made at higher temperatures. These temperature limits apply to the hotter surface. The cooler surface may be a few degrees cooler, in which case the particles are collected after exiting the hot zone (see, for example, FIG. 3); or the cooler surface may be sufficiently cooler that no film type deposition takes place there (see, for example, FIG. 4). In this case particular collection will take place on the cooler surface.

Figure 3:
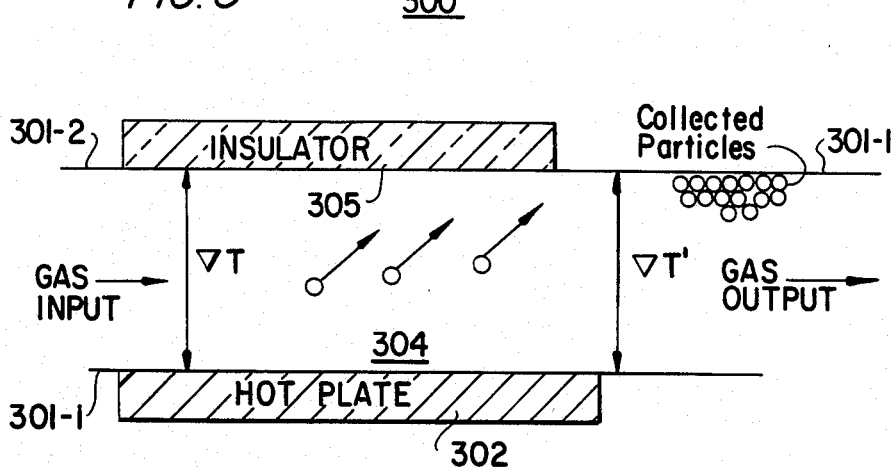
FIG. 3 is a schematic diagram of an illustrative reaction chamber for preparing particulate semiconductors in accordance with the invention.

An illustrative arrangement for preparing amorphous silicon particles in accordance with the invention is illustrated in FIG. 3.

In the arrangement of FIG. 3, a reactor 300 includes opposed surfaces 301-1 and 301-2. The surfaces 301-1 and 301-2 form a channel for the passage of a precursor gas and any dopant or carrier included with the precursor. A set of heating elements 302 are used to provide a relatively uniform heating effect on the surface 301-1. The interval 304 between the surface 301-1 and the surface 301-2 is heated by thermal conduction. The cooler surface 301-2 is sufficiently insulated so that it is in the desired temperature range for conversion of the precursors into amorphous silicon. As a result, an amorphous silicon film forms on the cooler surface 301-2 if it is above the decomposition temperature of the precursors. However, because of the temperature gradient existing between the hotter surface 301-1 and the cooler surface 301-2, molecules in the interval 304 striking a particle on the hot side impart, on the average, more momentum to the particle than those striking it on the cool side. This causes the particles to migrate to the cooler surface 301-2 and be collected at the region 301-3.

In a representative arrangement the surfaces 301-1 and 301-2 are separated in the range from about 0.5 centimeters to about 3 centimeters, with the preferred separation being between 1 and 2 centimeters. The lower surface 301-1 is maintained at a temperature on the order of 470° C. for disilane, while the upper surface 301-2 is at a lower temperature, for example 450° C. This produces a temperature gradient between the hot plate 302 and the insulator 305 of about 10° to 20° C./cm.

If necessary, the surface beyond the hot plate may be further cooled to aid collection of particles in this region.

Figure 4:
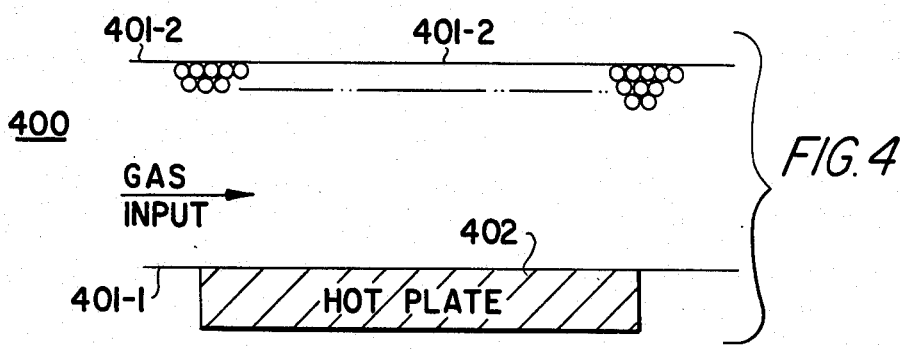
FIG. 4 is a schematic diagram of an alternative reaction chamber for preparing particulate semiconductors in accordance with the invention.

In the alternative arrangement of FIG. 4, the reactor 400 again includes opposed surfaces 401-1 and 401-2. However, by contrast with the reactor 300 of FIG. 3, the reactor 400 of FIG. 4 provides a larger separation and less insulation on surface 401-2. Because of this greater separation and less insulation, there is a greater temperature variation between the upper surface 401-2 and the lower surface 401-1. When a hot plate 402 at the lower surface 401-1 operates at approximately 450° C. the temperature at the upper surface 401-2 is reduced to avoid deposit of film, e.g. by being on the order of 300° C. or less. The thermophoretic force previously discussed also applies and particles are again collected as shown.

With the wider spacing used in the reactor 400 of FIG. 4, it is possible for the gas input to be turbulent. In addition, it is possible to collect a greater percentage of the particles. The doping material which accompanies the input gases determine whether the particles that are collected are n- or p-type.

In addition, if no doping materials are included with the input gases, the particles will be intrinsic, i.e. of the i-type. These particles may be included with the p- and n-particles discussed above in realizing the various devices in accordance with the invention.

Figure 5:
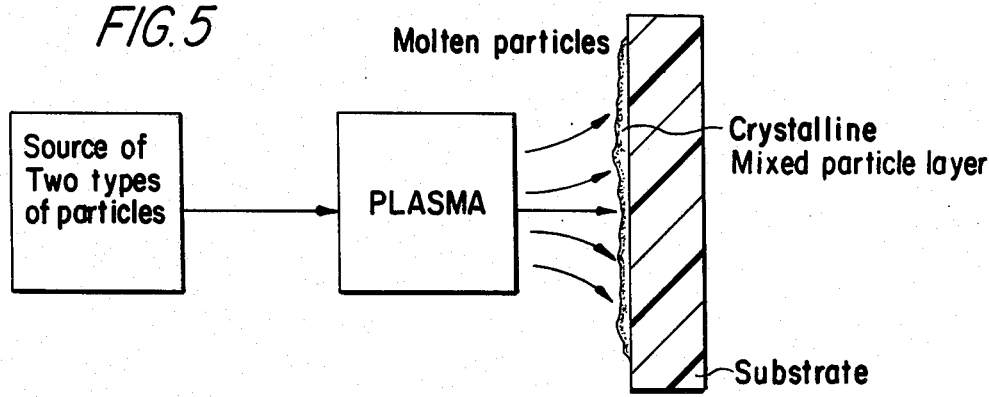
FIG. 5 is a schematic diagram of another alternative technique for preparing particulate semiconductors in accordance with the invention.

In the alternative technique of FIG. 5 for preparing particulate semiconductors in accordance with the invention, particles which have been produced, for example, in accordance with the flow chart of FIG. 2B, or by grinding, and are of n or p types, are subjected to a plasma, or preferably separate plasmas, resulting in molten particles. The particles then quickly cool and solidify upon contact with an inert substrate, forming a layer of crystalline particles of different types.

Although the foregoing examples have been confined to Group IV semiconductors, it will be appreciated that the invention covers all semiconducting materials, including, for example, gallium arsenide, cadmium sulfide, and cadmium telluride, together with their appropriate dopants and methods of forming small particles. Furthermore, the n and p particles need not be of the same semiconductor material, in which case they could be intrinsic, i.e. undoped, particles, since it is likely that the differences in their electron affinities and bandgaps are sufficient to establish the required electric field within and between particles.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. A semiconductor device comprising a first semiconductor, polymer or metal contact; a second semiconductor, polymer or metal contact; and a body comprising a plurality of particles of semiconductive material extending as different chains between and contacting respectively said first contact and said second contact.

2. A semiconductor device as claimed in claim 1 wherein said chains of different conductivity type respectively include a plurality of n-type particles or a plurality of p-type particles.

3. A semiconductor device as defined in claim 1 wherein one of the contacts is of a material having a prescribed work function and the other of said contacts is of a material having a lower work function than said prescribed work function; thereby to realize a prescribed junction between said first and second contacts.

4. A semiconductor device as defined in claim 3 wherein said first contact is of p-type and said second contact is of n-type; thereby to form a p-n junction between the first and second contacts.

5. A semiconductor device as defined in claim 1 wherein the particles range in size from about 10 Angstroms to about 3000 Angstroms in diameter.

6. A semiconductor device as defined in claim 5 wherein said particles are of n-type or p-type.

7. A semiconductor device as defined in claim 6 wherein n-type particles are in contact with one another to provide a continuous path for electrons and p-type particles are in contact with one another to provide a continuous path for holes.

8. A semiconductor device as defined in claim 5 wherein said particles are adhered to one another by an inorganic or organic binder, pressure, heat treatment or thermal fusion.

9. A semiconductor device as defined in claim 1 where at least one of the contacts comprises particles.

10. A semiconductor device as defined in claim 6, wherein particles of the same conductivity type form stringlike structures of the same conductivity type extending from one contact to another and having a smallest dimension ranging from about 10 Angstroms to 3000 Angstroms.

* * * * *